US008986835B2

(12) United States Patent
Wildeson et al.

(10) Patent No.: US 8,986,835 B2
(45) Date of Patent: Mar. 24, 2015

(54) GROWTH PROCESS FOR GALLIUM NITRIDE POROUS NANORODS

(75) Inventors: Isaac Harshman Wildeson, West Lafayette, IN (US); Timothy David Sands, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 728 days.

(21) Appl. No.: 13/080,165

(22) Filed: Apr. 5, 2011

(65) Prior Publication Data

US 2011/0244235 A1 Oct. 6, 2011

Related U.S. Application Data

(60) Provisional application No. 61/320,965, filed on Apr. 5, 2010.

(51) Int. Cl.
*C30B 25/04* (2006.01)
*C03C 25/22* (2006.01)
(Continued)

(52) U.S. Cl.
CPC .................. *B82Y 40/00* (2013.01); *B82Y 30/00* (2013.01); *C30B 25/04* (2013.01); *C30B 29/406* (2013.01); *C30B 29/66* (2013.01); *C30B 29/38* (2013.01); *Y10S 977/843* (2013.01)
USPC ............... 428/398; 117/87; 117/95; 117/952; 977/843

(58) Field of Classification Search
CPC ........ H01L 21/20; C30B 25/00; C30B 25/04; C30B 29/406; C30B 29/66; B82Y 30/00; B82Y 40/00
USPC .......................... 117/87, 95; 428/398; 977/843
See application file for complete search history.

(56) References Cited

U.S. PATENT DOCUMENTS 6,240,115 B1 * 5/2001 Chen et al. ................. 372/45.01
2002/0197825 A1 * 12/2002 Usui et al. ...................... 438/459
(Continued)

FOREIGN PATENT DOCUMENTS

WO WO 2008085129 A1 * 7/2008 .............. H01L 21/20

OTHER PUBLICATIONS

Effect of nanoporous GaN templates with different pore diameters on the subsequent thick GaN layers by HVPE, X.Z. Wang, G.H. Yua, C.T. Lin, M.X. Cao, H. Gong, M. Qi, A.Z. Li, Solid State Communications 150 (2010) 168-171.*

(Continued)

*Primary Examiner* — Michael Kornakov
*Assistant Examiner* — Hua Qi
(74) *Attorney, Agent, or Firm* — Brannon Sowers & Cracraft PC; C. John Brannon

(57) ABSTRACT

A GaN nanorod and formation method. Formation includes providing a substrate having a GaN film, depositing $SiN_x$ on the GaN film, etching a growth opening through the $SiN_x$ and into the GaN film, growing a GaN nanorod through the growth opening, the nanorod having a nanopore running substantially through its centerline. Focused ion beam etching can be used. The growing can be done using organometallic vapor phase epitaxy. The nanopore diameter can be controlled using the growth opening diameter or the growing step duration. The GaN nanorods can be removed from the substrate. The $SiN_x$ layer can be removed after the growing step. A $SiO_x$ template can be formed on the GaN film and the GaN can be grown to cover the $SiO_x$ template before depositing $SiN_x$ on the GaN film. The $SiO_x$ template can be removed after growing the nanorods.

3 Claims, 6 Drawing Sheets

(51) Int. Cl.
*D02G 3/22* (2006.01)
*B82Y 40/00* (2011.01)
*B82Y 30/00* (2011.01)
*C30B 29/40* (2006.01)
*C30B 29/66* (2006.01)
*C30B 29/38* (2006.01)

(56) References Cited

U.S. PATENT DOCUMENTS

| | | | |
|---|---|---|---|
| 2003/0010749 A1* | 1/2003 | Yoshizawa et al. | 216/56 |
| 2003/0082893 A1* | 5/2003 | Matsumoto et al. | 438/522 |
| 2005/0082543 A1* | 4/2005 | Alizadeh et al. | 257/79 |
| 2005/0179052 A1* | 8/2005 | Yi et al. | 257/183 |
| 2007/0085102 A1* | 4/2007 | Orita | 257/98 |
| 2008/0230785 A1* | 9/2008 | Murphy et al. | 257/76 |
| 2008/0277746 A1* | 11/2008 | Hsu et al. | 257/414 |
| 2008/0303029 A1* | 12/2008 | Kawashima et al. | 257/72 |
| 2010/0024869 A1* | 2/2010 | Wang et al. | 136/249 |

OTHER PUBLICATIONS

The Controlled Growth of GaN Nanowires, Stephen D. Hersee, Xinyu Sun, and Xin Wang, Nano Lett., vol. 6, No. 8, 2006, 1808-1811.*
Effect of nanoporous GaN templates with different pore diameters on the subsequent thick GaN layers by HVPE, X.Z. Wang, G.H. Yu, C.T. Lin, M.X. Cao, H. Gong, M. Qi, A.Z. Li, Solid State Communications 150 (2010) 168-171.*
Lin, V. S. Y.; Motasharei, K; Dancil, K.P.S.; Sailor, M.J.; Ghadiri, M. R., "A porous silicon-based optical interferometric biosensor," Science 1997, 278, 840-843.
Li, Y. H.; Buriak, J. M. "Dehydrogenative Silane Coupling on Silicon Surfaces via Early Transition Metal Catalysis," Inorganic Chemistry 2006, 45, 1096-1102.
Zang, K. Y.; Wang, Y. D.; Chua, S. J.; Wang, L. S.; Tripathy, S.; Thompson, C. V. "Nanoheteroepitaxial lateral overgrowth of GaN on nanoporous Si(111)," Applied Physics Letters 2006, 88, 141925.
Tenne, R. "Inorganic nanotubes and fullerene-like nanoparticles," Nature Nanotechnology 2006, 1, 103-111.
Daiguji, H.; Yang, P.; Majumbar, A. "Ion Transport in Nanofluidic Channels," Nano Letters 2004, 4, 137-142.
Lee, S. B.; Martin, C. R. "Electromodulated Molecular Transport in Gold-Nanotube Membranes," Journal of the American Chemical Society 2002, 124, 11850-11851.
Mitchell, D. T.; Lee, S. B.; Trofin, L.; Li, N.; Nevanen, T. K.; Soderlund, H.; Martin, C. R. "Smart Nanotubes for Bioseparations and Biocatalysis," Journal of the American Chemical Society 2002, 124, 11864-11865.
Chen, C. C.; Liu, Y. C.; Wu, C. H.; Yeh, C. C.; Su, M. T.; Wu, Y. C. "Preparation of Fluorescent Silica Nanotubes and Their Application in Gene Delivery," Advanced Materials 2005, 17, 404-407.
Gray, J. L.; Hull, R.; Floro, J. "Control of Surface Morphology Through Variation of Growth Rate in SiGe/Si(100) Epitaxial Films: Nucleation of 'Quantum Fortresses'," Applied Physics Letters 2002, 81, 2445.
Gray, J. L.; Hull, R.; Floro, J. A. "Periodic arrays of epitaxial self-assembled SiGe quantum dot molecules grown on patterned Si substrates," Journal of Applied Physics 2006, 100, No. 084312-7.
Jain, S. C.; Willander, M.; Narayan, J.; Overstraeten, R. V. "III-nitrides: Growth, characterization, and properties," Journal of Applied Physics 2000, 87, 965-1006.
Kim, H. G.; Deb, P.; Sands, T. "Nanopatterned Contacts to GaN," Journal of Electronic Materials 2007, 36, 359-367.
Wang, Y. D.; Zang, K. Y.; Chua, S. J.; Tripathy, S.; Chen, P.; Fonstad, C. G. "Nanoair-bridged Lateral Overgrowth of GaN on Ordered Nanoporous GaN Template," Applied Physics Letters 2005, 87, 251915.
Zang, K. Y.; Wang, Y. D.; Liu, H. F.; Chua, S. J. "Structural and Optical Properties of InGaN/GaN Multiple Quantum Wells Grown on Nano-air-bridged GaN Template," Applied Physics Letters 2006, 89, 171921.
Wang, Y. D.; Zang, K. Y.; Chua, S. J.; Fonstad, C. G. "Template-nonlithographic Nanopatterning for Site Control Growth of InGaN Nanodots," Applied Physics Letters 2006, 89, 241922.
Mynbaeva, M.; Titkov, A.; Kryganovskii, A.; Ratnikov, V.; Mynbaev, K.; Huhtinen, H.; Laiho, R.; Dmitriev, V. "Structural Characterization and Strain Relaxation in Porous GaN Layers," Applied Physics Letters 2000, 76, 1113.
Fareed, R. S. Q.; Adivarahan, V.; Chen, C. Q.; Rai, S.; Kuokstis, E.; Yang, J. W.; Khan, M. A.; Caissie, J.; Molnar, R. J. "Air-bridged Lateral Growth of Crack-free Al0.24Ga0.76N on Highly Relaxed Porous GaN," Applied Physics Letters 2004, 84, 696.
Carvajal, J. J.; Rojo, J. C. "Morphology Control in As-Grown GaN Nanoporous Particles," Crystal Growth and Design 2009, 9, 320-326.
Bae, S. Y.; Seo, H. W.; Park, J.; Yang, H.; Kim, B. "Porous GaN nanowires synthesized using thermal chemical vapor deposition," Chemical Physics Letters 2003, 376, 445-451.
Liu, B.; Bando, Y.; Tang, C.; Shen, G.; Golberg, D.; Xu, F. "Wurtzite-type Faceted Single-Crystalline GaN Nanotubes," Applied Physics Letters 2006, 88, No. 093120.
Liu, B.; Bando, Y.; Wang, M.; Tang, C.; Mitome, M.; Golberg, D. "Crystallography and elasticity of individual GaN nanotubes," Nanotechnology 2009, 20, 185705-6.
Goldberger, J.; He, R.; Zhang, Y.; Lee, S.; Yan, H.; Choi, H. J.; Yang, P. "Single-crystal gallium nitride nanotubes," Nature 2003, 422, 599-602.
Goldberger, J.; Fan, R.; Yang, P. "Inorganic Nanotubes: A Novel Platform for Nanofluidics," Accounts of Chemical Research 2006, 39, 239-248.
Mei, Y.; Thurmer, D. J.; Deneke, C.; Kiravittaya, S.; Chen, Y. F.; Dadgar, A.; Bertram, F.; Bastek, B.; Krost, A.; Christen, J.; Reindl, T.; Stoffel, M.; Coric, E.; Schmidt, O. G. "Fabrication, Self-Assembly, and Properties of Ultrathin AlN/GaN Porous Crystalline Nanomembranes: Tubes, Spirals, and Curved Sheets," ACS Nano 2009, 3, 1663-1668.
Deb, P.; Kim, H.; Rawat, V.; Oliver, M.; Kim, S.; Marshall, M.; Stach, E.; Sands, T. "Faceted and Vertically Aligned GaN Nanorod Arrays Fabricated without Catalysts or Lithography," Nano Letters 2005, 5, 1847-1851.
Wildeson, I. H.; Colby, R.; Ewoldt, D. A.; Liang, Z.; Zakharov, D. N.; Zaluzec, N. J.; Garcia, R. E.; Stach, E. A.; Sands, T. D. "III-nitride nanopyramid light emitting diodes grown by organometallic vapor phase epitaxy," Journal of Applied Physics 2010, 108, No. 044303-8.
Colby, R.; Liang, Z.; Wildeson, I. H.; Ewoldt, D. A.; Sands, T. D.; Stach, E. A.; Garcia, R. E. "Dislocation Filtering in GaN Nanostructures," Nano Letters 2010, 10, 1568-1573.
Liang, Z.; Colby, R.; Wildeson, I. H.; Ewoldt, D. A.; Sands, T. D.; Stach, E. A.; Garcia, R. E. "GaN nanostructure design for optimal dislocation filtering," Journal of Applied Physics 2010, 108, No. 074313-8.
Gibart, P. "Metal organic vapour phase epitaxy of GaN and lateral overgrowth," Reports on Progress in Physics 2004, 67, 667-715.
Inoki, C. K.; Kuan, T. S.; Lee, C. D.; Sagar, A.; Feenstra, R. M.; Koleske, D. D.; Diaz, D. J.; Bohn, P. W.; Adesida, I. "Growth of GaN on porous SiC and GaN substrates," Journal of Electronic Materials 2003, 32, 855-860.
Wang, X. Z.; Yu, G. H.; Lin, C. T.; Cao, M. X.; Gong, H.; Qi, M.; Li, A. Z. "Effect of nanoporous GaN templates with different pore diameters on the subsequent thick GaN layers by HVPE," Solid State Communications 2010, 150, 168-171.
Linthicum, K.; Gehrke, T.; Thomson, D.; Carlson, E.; Rajagopal, P.; Smith, T.; Batchelor, D.; Davis, R. "Pendeoepitaxy of Gallium Nitride Thin Films," Applied Physics Letters 1999, 75, 196.
Wu, Q.; Hu, Z.; Wang, X.; Lu, Y.; Chen, X.; Xu, H.; Chen, Y. "Synthesis and Characterization of Faceted Hexagonal Aluminum Nitride Nanotubes," Journal of the American Chemical Society 2003, 125, 10176-10177.
Xu, B.; Lu, A. J.; Pan, B. C.; Yu, Q. X. "Atomic structures and mechanical properties of single-crystal GaN nanotubes," Physical Review B 2005, 71, No. 125434-6.

* cited by examiner

GROWTH PROCESS FOR GALLIUM NITRIDE POROUS NANORODS

CROSS-REFERENCE TO RELATED APPLICATIONS

This application claims the benefit of U.S. Provisional Application Ser. No. 61/320,965, filed on Apr. 5, 2010, entitled "Growth Process for Gallium Nitride Porous Nanorods" which is incorporated herein by reference.

GOVERNMENTAL SUPPORT INFORMATION

This invention was made with government support under DE-FC26-06NT42862 awarded by Department of Energy. The government has certain rights in the invention.

BACKGROUND

The present invention relates to the growth and fabrication of nanorods, and more specifically to the growth and fabrication of Gallium Nitride (GaN) porous nanorods.

SUMMARY

Applications for porous nanorod structures as disclosed herein may include, but are not limited to, DNA sequencing, ion channel studies in cellular walls, near-field imaging, nanofluidics, solution field effect transistors, bioseparations and biocatalysis, gene delivery systems, quantum cellular automata architecture, microelectromechanical systems, and templates for nanoheterostructures for optical, electrical and biological applications. In the DNA sequencing area, similar nanopores are used that require many more processing steps to achieve a similar structure. In addition to simplifying the fabrication process, the disclosed structure provides the ability to utilize the crystalline, electrically conductive GaN walls of the nanopore. For example, the conductive properties can be used for sensing. Since GaN is a semiconductor, advantage can be taken of an electrical interface between a biological agent and the porous nanorod. Current nanopores used for DNA sequencing have insulating pore walls so they do not have this additional property. Another potential benefit of the disclosed structure is the ability to create and utilize strong polarization fields of GaN. GaN is a very robust material and well suited for biological as well as other applications. Another possible application of the disclosed structure, outside of biosensing, is near-field imaging where porous nanorods can be coated with a very thin layer of metal so that nearfield light can be collected with high resolution, for example a resolution of approximately 10 nm.

The fabrication process disclosed herein for creating nanopores in GaN can include the advantages that the resulting nanopore has an epitaxial lining on the pore walls, and/or that numerous pores with controlled positioning and diameter can be fabricated on a single wafer, and/or that the process has relatively few steps.

A method is disclosed for growing a nanorod that includes the steps of providing a substrate having a GaN thin film, depositing a $SiN_x$ layer on top of the GaN film, etching a growth opening through the $SiN_x$ layer and into the underlying GaN film; and growing a GaN nanorod through the growth opening, the GaN nanorod having a nanopore running substantially through the centerline of the nanorod. A plurality of growth openings can be etched through the $SiN_x$ layer and into the underlying GaN film, and a porous GaN nanorod can be grown through each of the plurality of growth openings. The thickness of the $SiN_x$ layer can be about 80 nm. The etching can be done using various methods, for example focused ion beam etching, reactive ion etching or inductively coupled plasma etching. The method can also include the steps of depositing a layer of Au/Pd on the $SiN_x$ layer before the etching; and removing the Au/Pd layer after the etching step and before the growing step. The growth opening can have a diameter ranging from about 165 nm to about 375 nm. The growing can be done using organometallic vapor phase epitaxy. The duration of the growing step can be about 30 seconds. The method can also include controlling the diameter of the growth opening or the duration of the growing step to control the diameter of the nanopore running through the nanorod. The method can also include removing the GaN film and nanorods from the substrate. The method can also include removing the $SiN_x$ layer after the growing step. The method can also include the following steps before depositing the $SiN_x$ layer: patterning $SiO_x$ strips on the GaN film to form a $SiO_x$ template; patterning a $SiO_x$ pad coupled to the $SiO_x$ template; growing GaN through the $SiO_x$ template until the height of GaN is slightly higher than that of the $SiO_x$ strips; and growing the GaN laterally to cover the $SiO_x$ template but not cover the $SiO_x$ pad.

A method is disclosed for growing a nanorod that includes the steps of providing a substrate having a GaN thin film, patterning $SiO_x$ strips on the GaN film to form a $SiO_x$ template, patterning a $SiO_x$ pad coupled to the $SiO_x$ template, growing GaN through the $SiO_x$ template until the height of GaN is slightly higher than that of the $SiO_x$ strips, growing the GaN laterally to cover the $SiO_x$ template but not cover the $SiO_x$ pad, depositing a $SiN_x$ layer on top of the GaN, etching a growth opening through the $SiN_x$ layer and the GaN into the underlying $SiO_x$ strips, and growing a GaN nanorod through the growth opening, the GaN nanorod having a nanopore running substantially through the centerline of the nanorod. The method can also include removing the $SiN_x$ layer, the $SiO_x$ template and the $SiO_x$ pad after the growing step. The etching can be done using focused ion beam etching, reactive ion etching or inductively coupled plasma etching, and the growing can be done using organometallic vapor phase epitaxy.

A substantially cylindrically-shaped nanorod is disclosed that includes a substantially cylindrically-shaped sidewall extending longitudinally from a first end to a second end, and a nanopore extending from the first end to the second end along substantially the centerline of the substantially cylindrically-shaped nanorod. The sidewall is composed of GaN. The diameter of the substantially cylindrically-shaped nanorod can range between about 165 nm and about 375 nm. The diameter of the nanopore can range between about 10 nm and about 155 nm.

DESCRIPTION OF EXEMPLARY EMBODIMENTS

Figure 1:
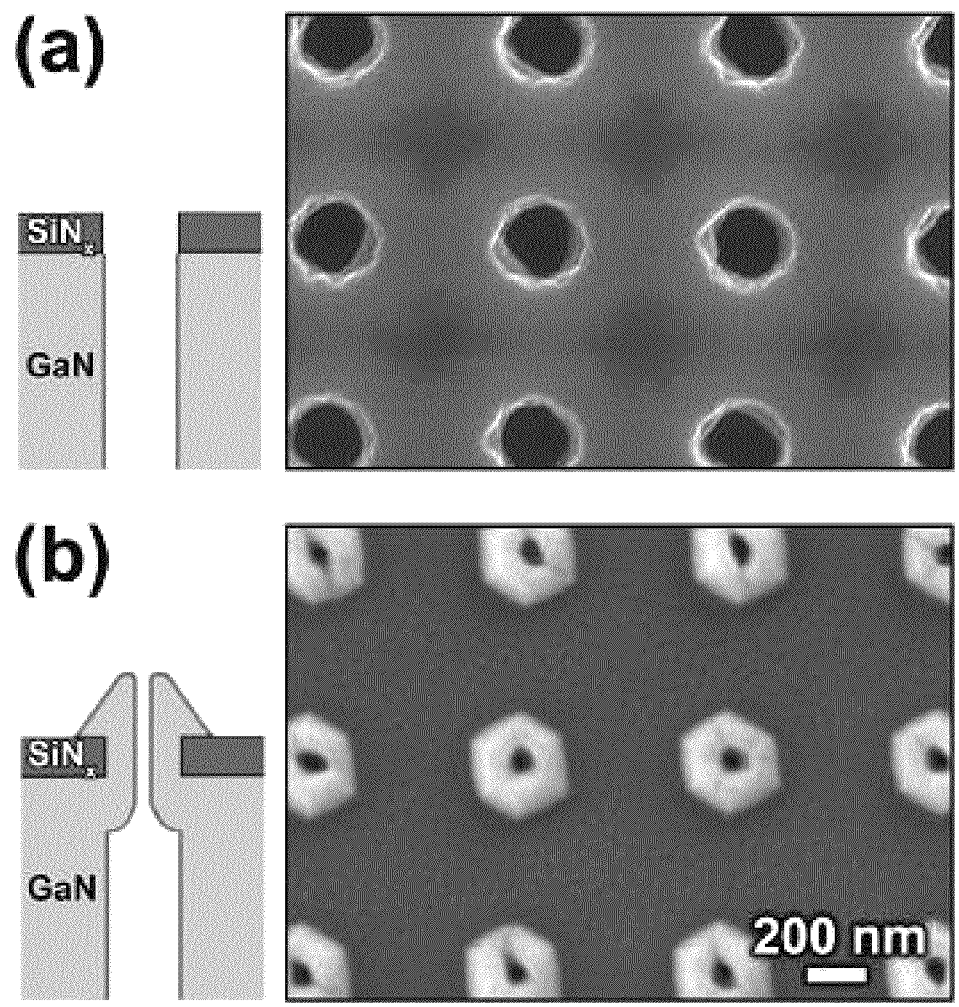
FIG. 1A is a cross-section schematic and plan-view scanning electron microscope image of an exemplary array of growth openings etched into $SiN_x$ and GaN by focused ion beam etching.
FIG. 1B is a cross-section schematic and plan-view scanning electron microscope image of porous GaN nanorods grown through openings in $SiN_x$ as shown in FIG. 1A.

For the purposes of promoting an understanding of the principles of the novel technology, reference will now be made to the exemplary embodiments described herein and illustrated in the drawings and specific language will be used to describe the same. It will nevertheless be understood that no limitation of the scope of the novel technology is thereby intended, such alterations and further modifications in the illustrated devices and methods, and such further applications of the principles of the novel technology as illustrated therein being contemplated as would normally occur to one skilled in the art to which the novel technology relates.

A process is disclosed for fabricating Gallium Nitride (GaN) nanorods with pores running through each nanorod approximately along its centerline. The pores have a high-quality, electrically active epitaxial lining that is suitable for sensing applications. The pores through the nanorods may also be connected to underlying channels that connect these pores to the outside. Nanopores can be fabricated with a range of diameters, for example ranging from about 10 nm to about 155 nm, on a single wafer, and the location of the nanopores can be controlled. Applications of such a structure may include, but are not limited to, DNA sequencing, ion channel studies in cellular walls, near-field imaging, nanofluidics, solution field effect transistors, bioseparations and biocatalysis, gene delivery systems, quantum cellular automata architectures, microelectromechanical systems and templates for nanoheterostructures for optical, electrical and biological applications.

The following fabrication steps were used to grow porous GaN nanorods. The starting substrate is a GaN thin film on a sapphire substrate. The thickness of the GaN film in initial experiments was approximately 7 μm. Approximately 80 nm of $SiN_x$ was deposited on top of the GaN film. The $SiN_x$ can serve as a growth mask in subsequent steps. Following the $SiN_x$ deposition, about 1 nm of Au/Pd was deposited on the surface to minimize ion beam drifting during Focused Ion Beam (FIB) etching of the growth template. Growth openings with diameters ranging from about 165 nm-375 nm were etched through the $SiN_x$ and into the underlying GaN via FIB. Beyond about 200 nm, the etching depth can be varied with negligible effect on nanorod growth as growth nucleates on only about 150 nm of GaN on the sidewalls of the etched pore. FIG. 1A is a cross-section schematic and plan-view scanning electron microscope image of an exemplary array of growth openings etched into $SiN_x$ and GaN by focused ion beam etching.

Samples were then cleaned with wet chemistry prior to growth. First, the samples were dipped in Aqua Regia for about 30 seconds. This dipping can remove Au/Pd. Following the Aqua Regia clean, the samples were placed in a Piranha solution for about 3 minutes. This step can remove organics from the surface.

Porous GaN nanorods were grown in an Aixtron 200HT organometallic vapor phase epitaxy (OMVPE) reactor. Prior to deposition, samples were heated to about 1030° C. in a mixture of 2:3 $NH_3:H_2$, and were held at this temperature for approximately 3 minutes in an effort to recrystallize any remaining damaged GaN. Growth of porous nanorods lasted a duration of about 30-60 seconds at 1030° C. with hydrogen as the carrier gas. The result of growth is a nanorod with a generally cylindrical-shaped pore running through its center and into the underlying etched region below. FIG. 1B is a cross-section schematic and plan-view scanning electron microscope image of porous GaN nanorods grown through openings in $SiN_x$, such as the growth openings shown in FIG. 1A.

Figure 2:
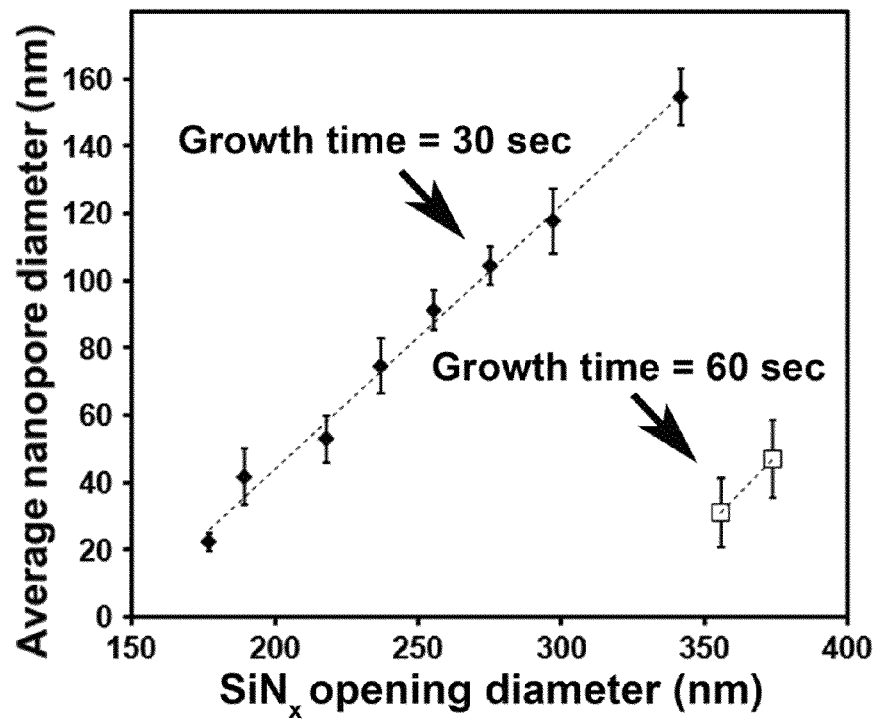
FIG. 2 is a plot illustrating the linear relationship between the growth opening diameter and the resulting average nanopore diameter for a 30 second growth (solid diamonds) and for a 60 second growth (open squares)

The diameter of the pore can be altered by changing the diameter of the growth window through which the porous nanorod grows as well as by altering the growth time. The nanopore diameter can be decreased by growing through a smaller growth window or by increasing the GaN growth time. FIG. 2 is a graph of the relationship between the average nanopore diameter and the growth window diameter for both 30 and 60 second GaN growth. The graph shows a substantially linear relationship between the growth opening diameter and the resulting average nanopore diameter. The solid diamonds are for a 30 second growth time and the open squares are for a 60 second growth time. Such pores can be connected to channels under the GaN that result from epitaxial lateral overgrowth and subsequent wet etching of the dielectric mask.

About 1 um wide strips of $SiO_x$ can be patterned on the GaN surface along with a larger area $SiO_x$ pad at one end of the strip. The thickness of the $SiO_x$ film can be determined by the aspect ratio for wet etching in a later step. After the patterning of $SiO_x$ strips, GaN can be grown until the height of GaN is slightly higher than that of the $SiO_x$. There may be some slight overgrowth at the edges at this point. Once the GaN film has overcome the template, the V/III ratio, the growth temperature, the chamber pressure, and/or other parameters can be adjusted to promote lateral growth of GaN on top of the $SiO_x$ template. A potential result can be 1 μm wide strips of $SiO_x$ buried under approximately 100-1000 nm of GaN with access to the surface via a large $SiO_x$ pad that is too wide to be completely overgrown. At this point, 80 nm of $SiN_x$ can be deposited on the GaN surface and the process described above can be used to pattern pores within the $SiN_x$ so that the pores sit atop the underlying $SiO_x$ strips. During the etching, the pore depth should be great enough to punch completely through the GaN and into the underlying $SiO_x$ strips.

Following the growth, the sample may undergo wet chemical etching that can remove both the nanorod growth template as well as the underlying $SiO_x$ in channels beneath the nanorods. The $SiN_x$ and $SiO_x$ can be used interchangeably and the wet chemistry can be changed accordingly. The result is an epitaxial nanorod with a pore running substantially through the center of the nanorod. The pore can be connected to a hollowed channel with access to the outside.

Figure 3:
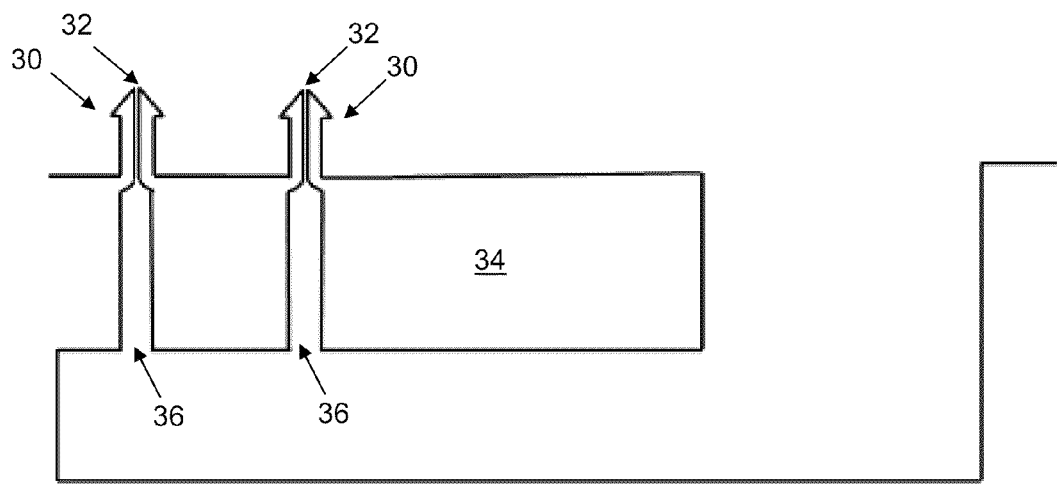
FIG. 3 illustrates an exemplary cross-section of porous GaN nanorods with channel connections to the outside after removal of $SiN_x$ and $SiO_x$.

FIG. 3 shows an exemplary cross-section of GaN porous nanorods with channel connections to the outside after removal of $SiN_x$ and $SiO_x$. FIG. 3 shows a pair of nanorods 30 with generally central nanopores 32 growing vertically from the GaN film 34. Each of the nanorods 30 is shown growing above a growth opening 36.

An alternative approach for connecting the porous nanorods to the outside is the use of laser lift-off, where the GaN film is removed from the sapphire substrate. Now the back side of the GaN film can be etched using common lithography in order to make reservoirs that connect to the pores in the nanorods.

In operation, a method for growing a nanorod includes the steps of first providing 90 $SiO_x$, second providing 100 a substrate 105 having a GaN thin film 34, first patterning 110 $SiO_x$ strips 115 on the GaN film 34 to form a $SiO_x$ template 120, second patterning 125 a $SiO_x$ pad 130 coupled to the $SiO_x$ template, first growing 135 a GaN body 140 through the $SiO_x$ template 120 until the height of the GaN nanorod 30 is slightly higher than that of the $SiO_x$ strips 115, second growing 150 the GaN body 140 laterally to cover the $SiO_x$ template 120 but not cover the $SiO_x$ pad 130, depositing 155 a $SiN_x$ layer 160 on top of the GaN body 140, etching 165 a growth opening 17036 through the $SiN_x$ layer 160 and the GaN body 140 into the underlying $SiO_x$ strips 115, third growing 175 a GaN nanorod 30 through the growth opening 36, and forming 180 nanopore running substantially through the centerline of the GaN nanorod 30. The method can also include removing the $SiN_x$ layer 160, the $SiO_x$ template 120 and the $SiO_x$ pad 130 after the growing step 150. The etching 165 can be done using focused ion beam etching, reactive ion etching or inductively coupled plasma etching, and the growing can be done using organometallic vapor phase epitaxy.

Figure 4A:
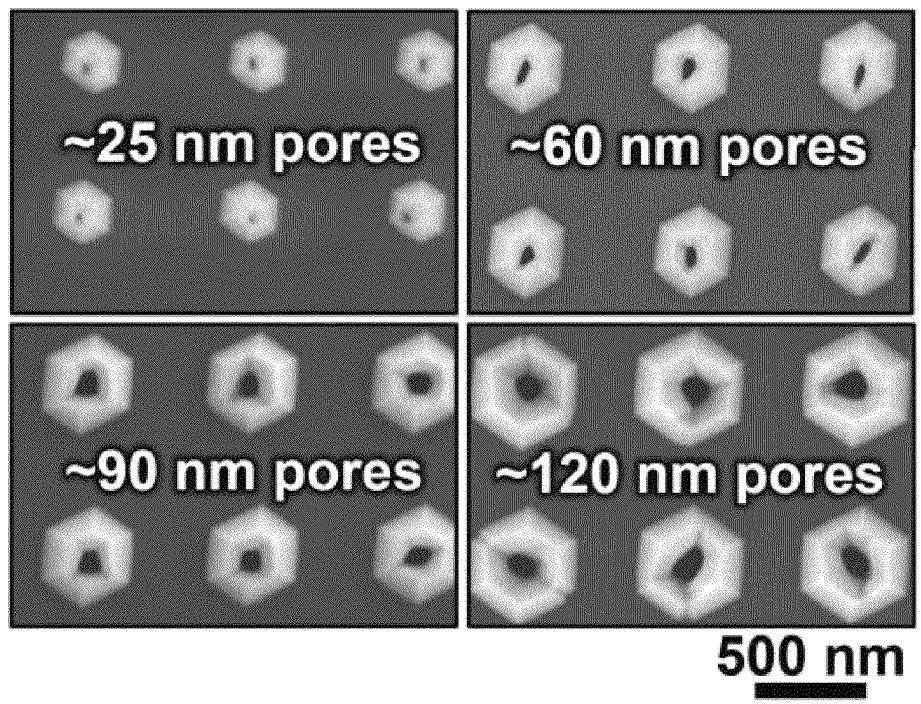
FIG. 4A shows plan-view scanning electron microscope images of porous GaN nanorods grown out of a $SiN_x$ template where the GaN nanorods have varying diameters corresponding to growth windows with varying diameters according to the relationship shown in FIG. 3 (all nanorods shown here are grown on the same wafer)
Figure 4B:
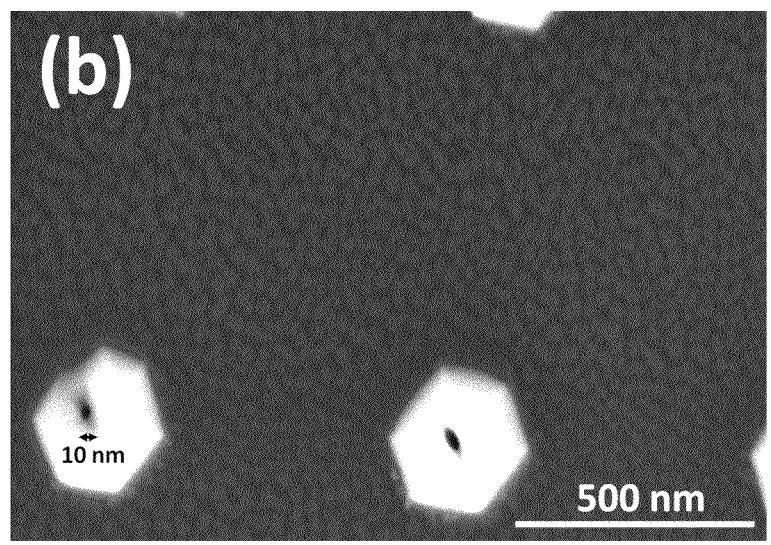
FIG. 4B is a plan-view scanning electron microscope image of porous GaN nanorods growing out of a $SiN_x$ template where the GaN nanorods include a substantially central nanopore having a diameter of approximately 10 nm.

The diameter of the pore within the nanorod can be varied by changing the diameter of the nanorod. FIGS. 4A and 4B show plan view scanning electron microscope images of porous GaN nanorods growing out of $SiN_x$ templates that were patterned via focused ion beam etching. Each GaN nanorod includes a substantially central nanopore with a diameter that varies with its growth window according to the relationship shown in FIG. 3. In these exemplary nanorods, the nanopore diameters are tuned from approximately 10 nm to approximately 120 nm and this range may be expanded.

Figure 5:
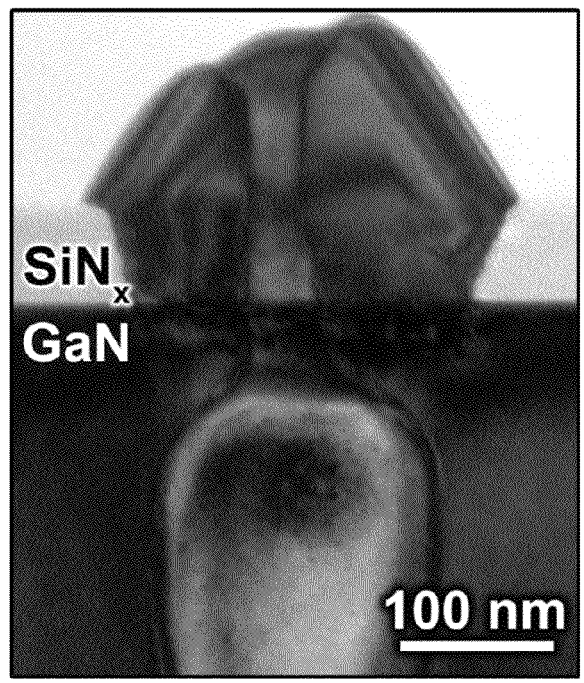
FIG. 5 is a transmission electron microscope image of a porous GaN nanorod growing out of a $SiN_x$ template where the GaN nanorod includes a substantially central nanopore having a diameter of approximately 35 nm.

FIG. 5 shows a cross-section transmission electron microscope image of a GaN nanorod growing out of a $SiN_x$ template. The porous GaN nanorod has a substantially central nanopore with a diameter of approximately 35 nm.

Figure 6:
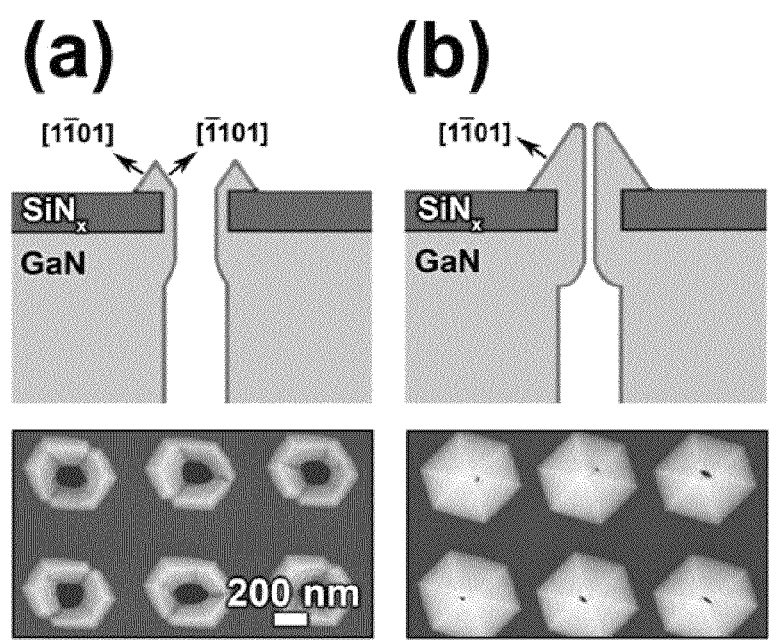
FIG. 6A is a cross-section schematic and plan-view scanning electron microscope image of a porous GaN nanorod that includes a substantially central nanopore that is primarily outlined by semipolar $\{1\bar{1}01\}$ planes.
FIG. 6B is a cross-section schematic and plan-view scanning electron microscope image of a porous GaN nanorod that includes a substantially central nanopore that is primarily outlined by nonpolar planes (e.g., $\{1\bar{1}00\}$ and $\{11\bar{2}0\}$).
Figure 7:
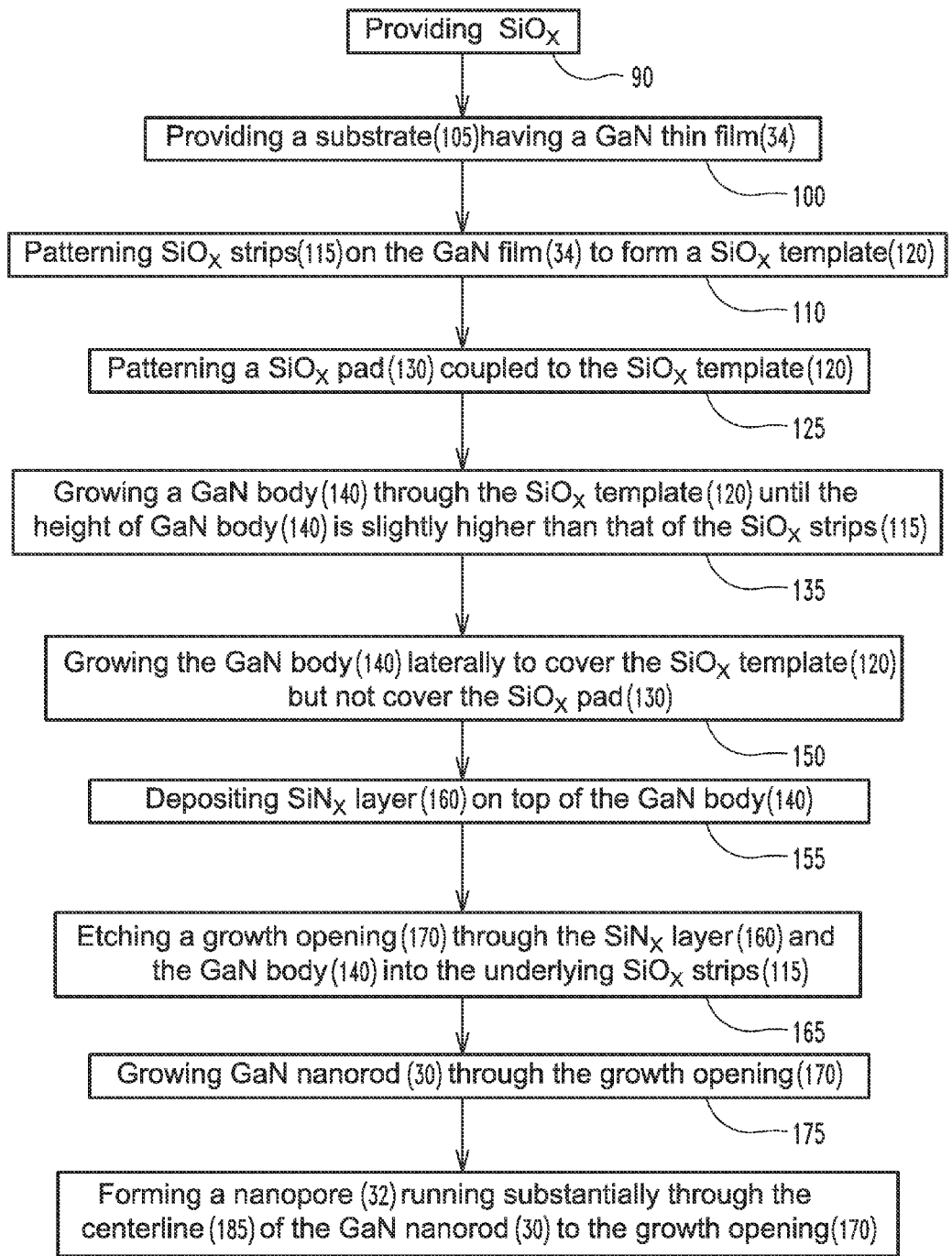
Figure 7:
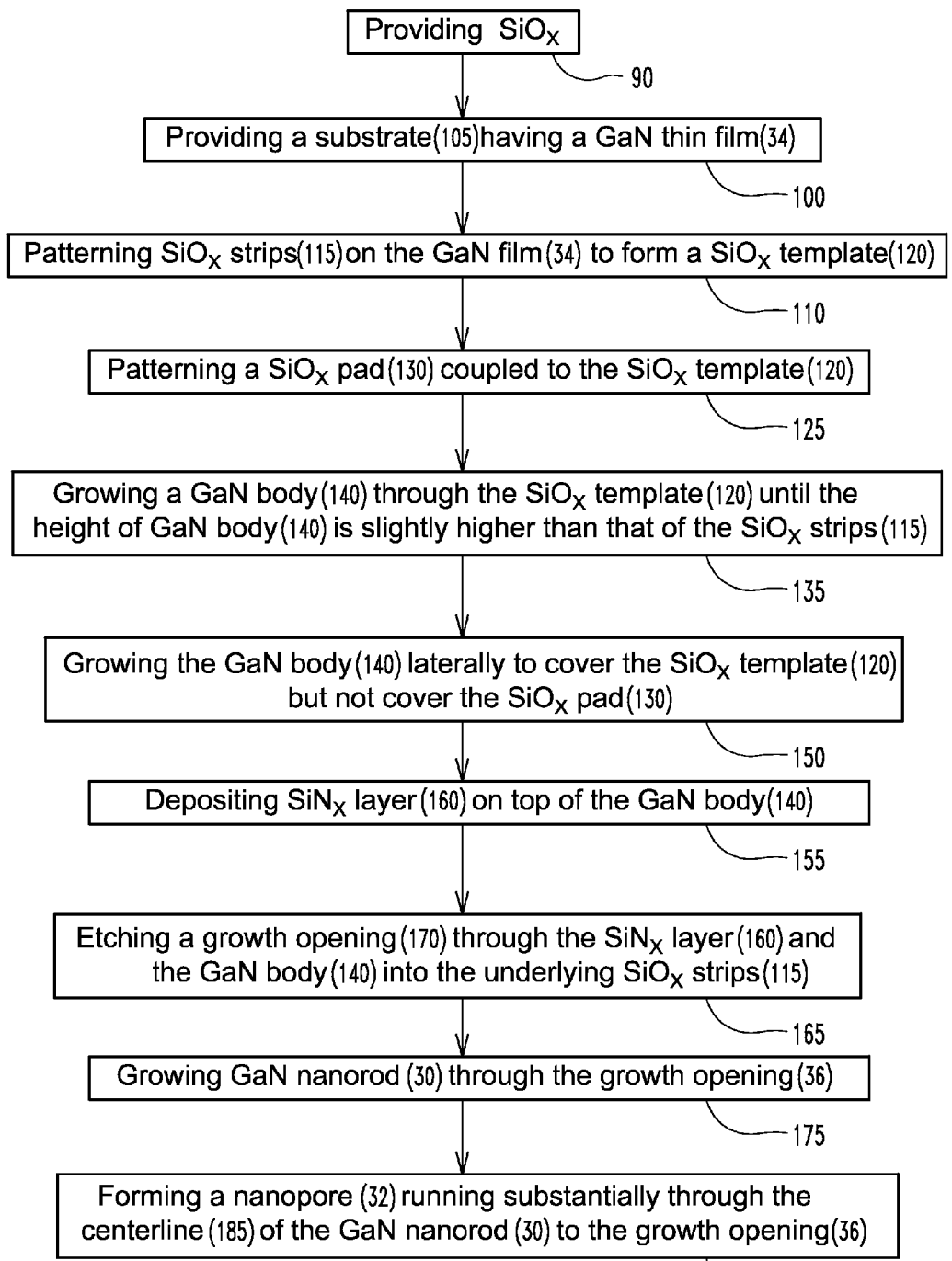

The orientation of the planes that outline the nanopore can be varied by changing the diameter of the growth openings and the growth time. FIG. 6 shows that $\{1\bar{1}01\}$ planes primarily outline 155 nm diameter nanopores in porous nanorods grown through 340 nm diameter growth windows, and that nonpolar (e.g., $\{1\bar{1}00\}$ and $\{11\bar{2}0\}$) planes outline 30 nm diameter nanopores in porous nanorods grown through 355 nm diameter growth windows. This variability in orientation of the planes that outline the nanopore can be used for variability in different applications (e.g., sensing), as the different plane orientations possess different polarization fields that may affect electrical applications.

While exemplary embodiments incorporating the principles of the present invention have been disclosed hereinabove, the present invention is not limited to the disclosed embodiments. Instead, this application is intended to cover any variations, uses, or adaptations of the invention using its general principles. Further, this application is intended to cover such departures from the present disclosure as come within known or customary practice in the art to which this invention pertains.

We claim:

1. A method for growing a nanorod, the method comprising: providing $SiO_x$ for patterning strips and pads; providing a substrate having a GaN thin film; patterning $SiO_x$ strips on the GaN film to form a $SiO_x$ template; patterning a $SiO_x$ pad coupled to the $SiO_x$ template; growing GaN through the $SiO_x$ template until the height of GaN is slightly higher than that of the $SiO_x$ strips; growing the GaN laterally to cover the $SiO_x$ template but not cover the $SiO_x$ pad; depositing a $SiN_x$ layer on top of the GaN; etching a growth opening through the $SiN_x$ layer and the GaN into the underlying $SiO_x$ strips; and growing a GaN nanorod through the growth opening, the GaN nanorod having a nanopore running substantially through the centerline of the nanorod to the growth opening.

2. The method of claim 1, further comprising removing the $SiN_x$ layer, the $SiO_x$ template and the $SiO_x$ pad after the growing step.

3. The method of claim 1, wherein etching is done using focused ion beam etching, and the growing of the GaN nanorod is done using organometallic vapor phase epitaxy.

* * * * *